United States Patent
Fukumoto et al.

(10) Patent No.: US 9,939,491 B2
(45) Date of Patent: *Apr. 10, 2018

(54) RELAY UNIT, CONTROL METHOD FOR RELAY UNIT

(71) Applicant: OMRON Corporation, Kyoto-shi, Kyoto (JP)

(72) Inventors: Tetsuya Fukumoto, Kusatsu (JP); Toshiyuki Higuchi, Kusatsu (JP); Kohei Murakami, Kusatsu (JP); Satoshi Fujii, Kusatsu (JP)

(73) Assignee: OMRON Corporation, Kyoto-shi (JP)

( * ) Notice: Subject to any disclaimer, the term of this patent is extended or adjusted under 35 U.S.C. 154(b) by 191 days.

This patent is subject to a terminal disclaimer.

(21) Appl. No.: 14/882,534

(22) Filed: Oct. 14, 2015

(65) Prior Publication Data

US 2016/0223614 A1 Aug. 4, 2016

(30) Foreign Application Priority Data

Feb. 2, 2015 (JP) .................................. 2015-018896

(51) Int. Cl.
    *G01R 31/327* (2006.01)
    *H01H 47/00* (2006.01)
    *H01H 50/16* (2006.01)

(52) U.S. Cl.
    CPC ....... *G01R 31/3278* (2013.01); *H01H 47/002* (2013.01); *H01H 47/004* (2013.01); *H01H 50/16* (2013.01)

(58) Field of Classification Search
    USPC ......... 324/423, 424, 420, 421; 370/241, 242
    See application file for complete search history.

(56) References Cited

U.S. PATENT DOCUMENTS 5,586,111 A * 12/1996 Wise ....................... H04M 3/30
                                                          370/241
2009/0251835 A1   10/2009  Meinherz

FOREIGN PATENT DOCUMENTS

| EP | 1202313 A1 | 5/2002 |
| JP | H05-055435 U | 7/1993 |
| JP | H09-293440 A | 11/1997 |

* cited by examiner

*Primary Examiner* — Vincent Q Nguyen

(74) *Attorney, Agent, or Firm* — Metrolexis Law Group, PLLC

(57) ABSTRACT

The reliability of testing a normally closed contact in a relay unit may involve the following. Sending a first test signal to the first normally closed contact and detecting a return state of the first test signal sent, sending a second test signal different from the first test signal to the second normally closed contact and detecting a return state of the second test signal sent; and assessing an abnormality when at least one of the detection result for the return state of the first test signal does not satisfy a first predetermined criteria, and the detection result of the return state of the second test signal does not satisfy a second predetermined criteria different from the first predetermined criteria.

14 Claims, 18 Drawing Sheets

RELAY UNIT, CONTROL METHOD FOR RELAY UNIT

FIELD

The present invention relates to a relay unit.

BACKGROUND

Relaying units switching between energizing and de-energizing a load (also called "relay units") may be provided with mechanical switching elements containing normally open contacts (a contacts) and normally closed contacts (b contacts). Refer to European Patent Application Publication No.: EP1202313A1 (Published 2 May 2002) and Patent Document 2: Japanese Utility Model Application Publication No. H05-55435 (Published 23 Jul. 1993), for example.

Technical Problem

A normally closed contact in a relay unit of this type may be monitored (tested) using the state of a signal sent while the load is de-energized. However, there are cases where abnormalities occurring due to noise in the normally closed contact during monitoring (e.g., an ON defect in the normally closed contact) cannot be correctly detected.

Among other improvements the present invention proposes improving the reliability of testing a normally closed contact in a relay unit.

SUMMARY

A relay unit according to embodiments of the present invention includes: a switching circuit including first and second normally open contacts and first and second normally closed contacts; and a controller; the switching circuit in a state of de-energizing a load when the first and second normally open contacts are open and the first and second normally closed contacts are closed, and in a state of energizing a load when the first and second normally open contacts are closed and the first and second normally closed contacts are open; and the controller sending a first test signal to the first normally closed contact and detecting the state of the returning first test signal sent, sending a second test signal different from the first test signal to the second normally closed contact and detecting the state of the returning second test signal sent; and assessing the states as abnormal when at least one of the result of detecting the state of the returning first test signal does not satisfy a first predetermined criteria, and the result of detecting the state of the returning second test signal does not satisfy a second predetermined criteria different from the first predetermined criteria.

Effects

According to the above configuration, because the first test signal and the second test signal, as well as the first predetermined criteria and the second predetermined criteria are different, the controller is able to assess that the state of the returning test signal is abnormal given that the state of the returning second test signal does not satisfy the second predetermined criteria even if the first and second normally closed contacts both experienced an ON defect, and noise similar to the returning first test signal from the first and second normally closed contacts entered the controller. Thus, the reliability of testing a normally closed contact in a relay unit may be improved.

DETAILED DESCRIPTION

Figure 1A:
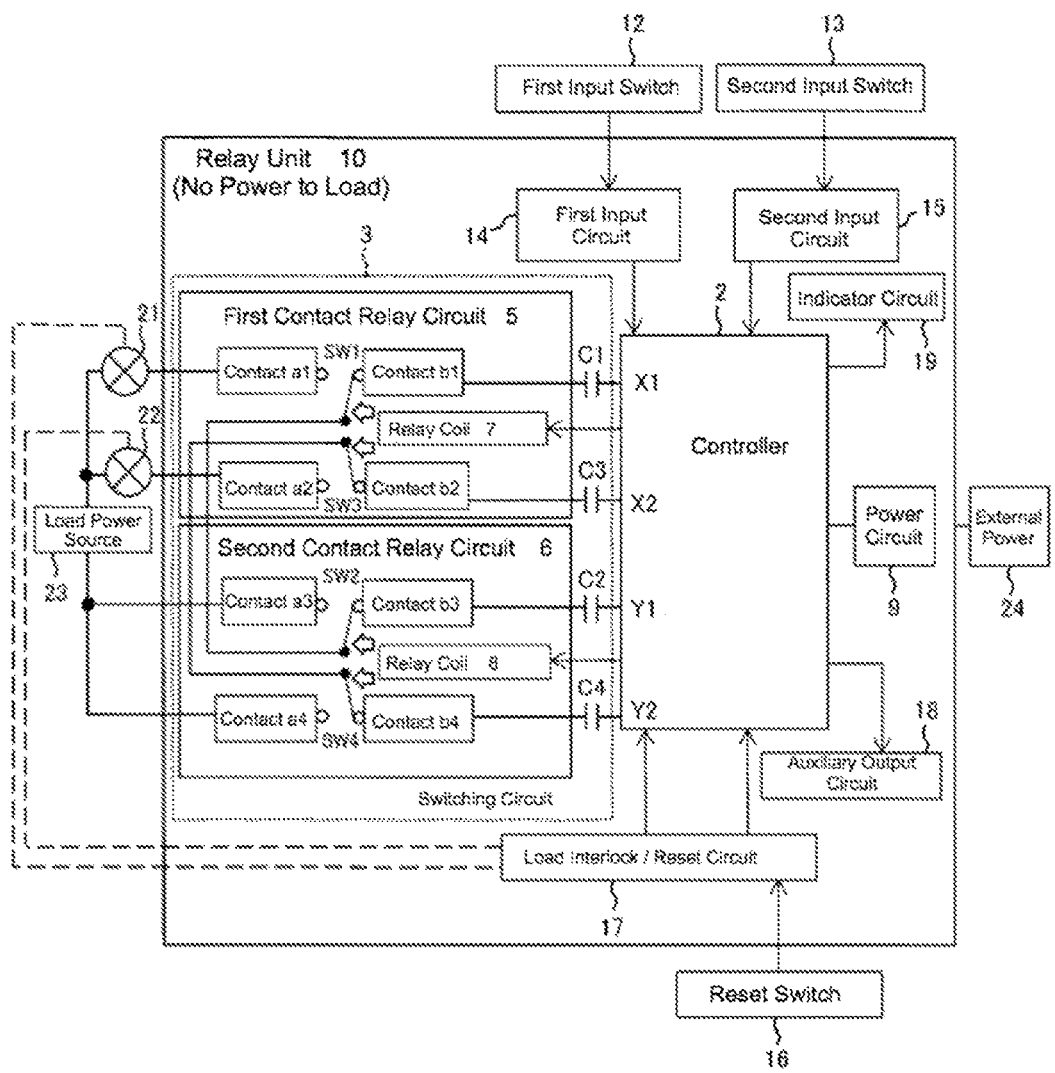
FIGS. 1A to 1C are block diagrams illustrating the configuration of a relay unit according to an embodiment while no power is sent to the load.

As illustrated in FIGS. 1A to 1C and 2A to 2C, the relay unit 10 according to a second embodiment is provided with a controller 2, a switching circuit 3, a power circuit 9, a first and a second input circuit 14, 15, a load interlock and reset circuit 17, an auxiliary output circuit 18, and an indicator circuit 19. The first input circuit 14 receives an input from an external first input switch 12; the second input circuit 15 receives an input from an external second input switch 13; and the load interlock and reset circuit 17 receives an input from an external reset switch 16. An external power source 24 (a direct-current power source) contains a power circuit 9 connected to the controller 2; the external power source 24 supplies electrical power to each of the components in the relay unit 10.

Figure 1B:
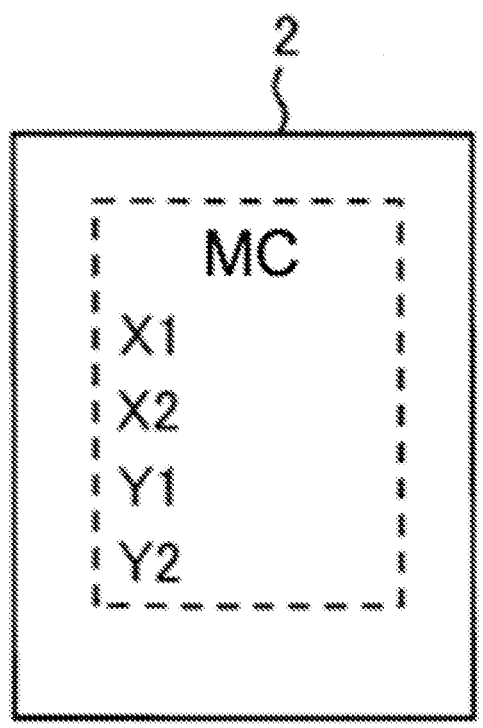
Figure 1C:
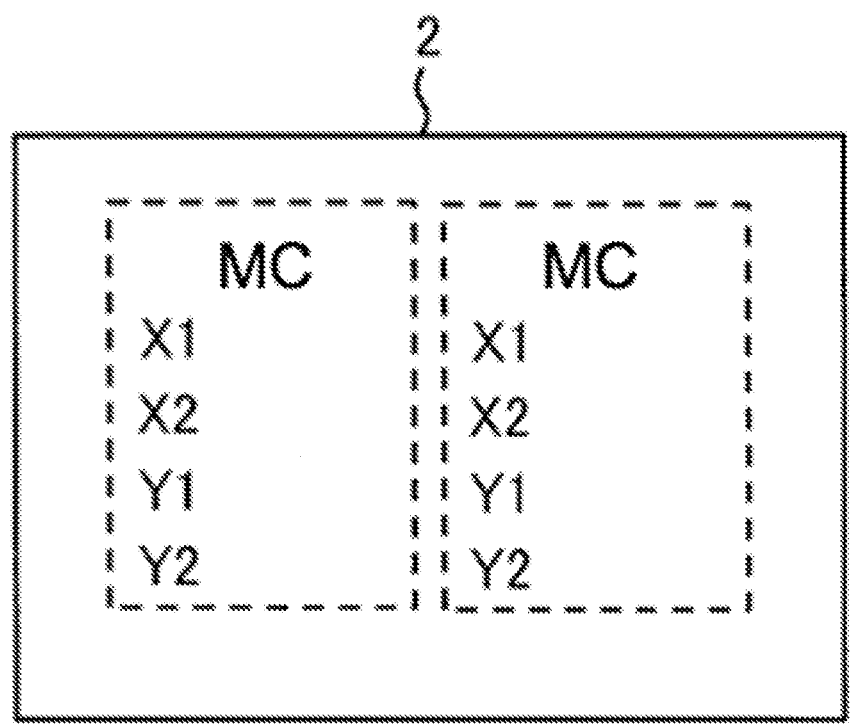

As illustrated in FIG. 1B and FIG. 1C, the controller 2 is made up of one (FIG. 1B) or two (FIG. 1C) microcomputers (MC) which function as processors that run the programs stored in memory.

The switching circuit 3 is provided with a first contact relay circuit 5, a second contact relay circuit 6, and four insulating capacitors C1-C4.

The first contact relay circuit 5 is a double pole relay equipped with a mechanical switch SW1 containing a contact a1 and a contact b1 (a first normally open contact and a first normally closed contact), a mechanical switch SW2 containing a contact a2 and a contact b2 (a second normally open contact and a second normally closed contact), and a relay coil 7. Exciting the relay coil 7 generates a magnetic field and the magnetic field changes the state of the switches SW1, SW2. That is, when the normally open contact a1 is open, the normally closed contact b1 is closed, and when the normally open contact a1 is closed, the normally closed contact b1 is open. Further, when the normally open contact a2 is open, the normally closed contact b2 is closed, and when the normally open contact a2 is closed, the normally closed contact b2 is open.

The second contact relay circuit 6 is a double pole relay equipped with a mechanical switch SW3 containing a contact a3 and a contact b3 (a third normally open contact and a third normally closed contact), a mechanical switch SW4 containing a contact a4 and a contact b4 (a fourth normally open contact and a fourth normally closed contact), and a relay coil 8. Exciting the relay coil 8 generates a magnetic field and the magnetic field changes the state of the switches SW3, SW4. That is, when the normally open contact a3 is open, the normally closed contact b3 is closed, and when the normally open contact a3 is closed, the normally closed contact b3 is open. Further, when the normally open contact a4 is open, the normally closed contact b4 is closed, and when the normally open contact a4 is closed, the normally closed contact b4 is open.

Note that the normally closed contacts b1, b2, b3, b4 are connected to the controller 2 via the insulating capacitors C1, C2, C3, C4 respectively. The load 21 and the load power source 23 (alternating current power source) are also connected in series between the normally open contacts a1, a3. A load 22 and the load power source 23 are also connected in series between the normally open contacts a2, a4.

The controller 2 controls the flow of electricity through each of the relay coils 7, 8 in the switching circuit 3 to switch the relay unit between de-energizing (FIG. 1A) and energizing (FIG. 2A) the loads 21, 22. That is, the normally open contact a1, the normally open contact a2, normally open contact a3, and the normally open contact a4 (abbreviated, normally open contacts a1-a4, below) are open, and the normally closed contact b1, normally closed contact b2, normally closed contact b3, and the normally closed contact b4 (abbreviated, normally closed contacts b1-b4, below) are closed so that no power is sent to the loads 21, 22; furthermore, the normally open contacts a1-a4 are closed, and the normally closed contacts b1-b4 are opened so that power is sent to the loads 21, 22.

As illustrated in FIG. 1A, when the loads 21, 22 are de-energized, the normally closed contacts b1, b3 are connected, creating a first channel (channel 1) from a terminal X1 to a terminal Y1 in the controller 2 passing through the insulating capacitor C1, the normally closed contact b1, the normally closed contact b3, and the insulating capacitor C3. Moreover, when the loads 21, 22 are de-energized, the normally closed contacts b2, b4 are connected, creating a second channel (channel 2) from a terminal X2 to a terminal Y2 in the controller 2 through the insulating capacitor C2, the normally closed contact b2, the normally closed contact b4, and the insulating capacitor C4.

Figure 2A:
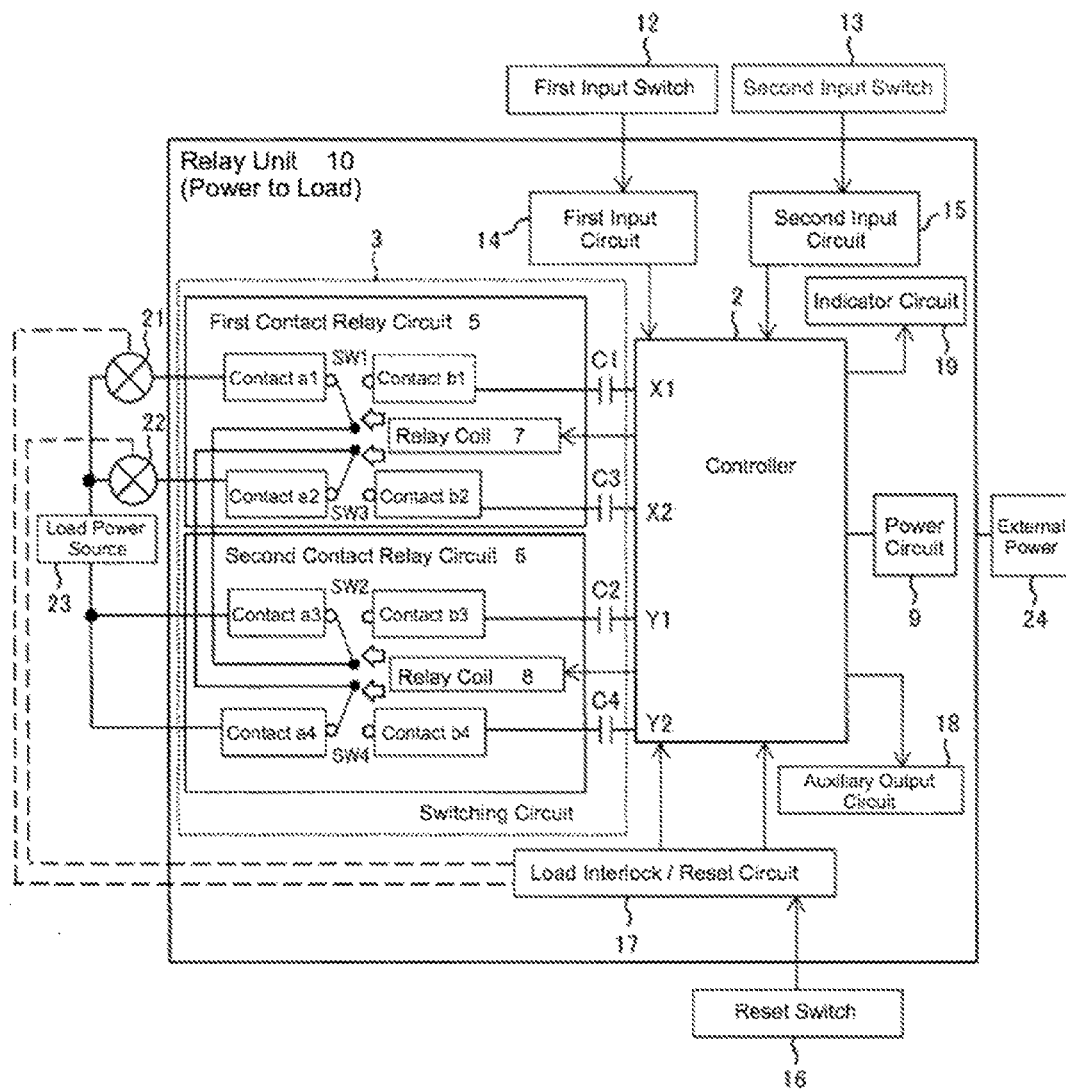
FIGS. 2A to 2C are block diagrams illustrating the configuration of the relay unit according to the embodiment while power is sent to the load.
Figure 2B:
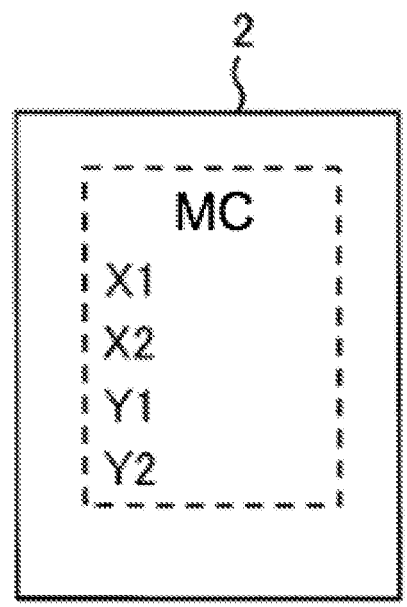
Figure 2C:
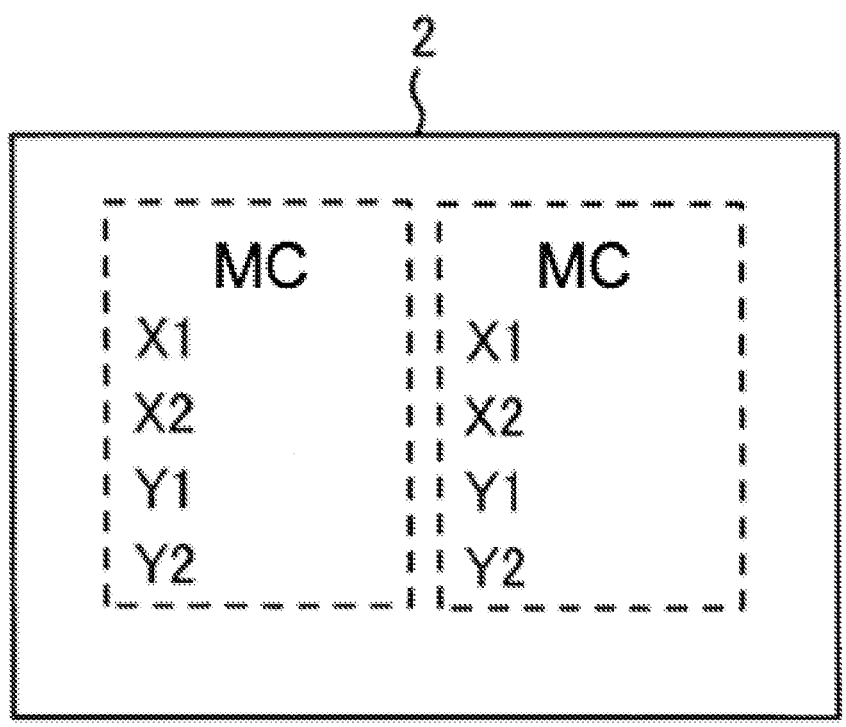

As illustrated in FIG. 2A, when the loads 21, 22 are energized, the normally open contacts a1, a3, the load 21, and the load power source 23 are connected in series, and the normally open contacts a2, a4, the load 22, and the load power source 23 are connected in series. Note that the first and second contact relays 5, 6 are arranged in series so that the loads 21, 22 can be disconnected even when an ON defect (a fault where the normally open contact a becomes normally closed) occurs in one of the contact relay circuits (i.e, for redundancy).

A sequence of operations in the relay unit 10 is described below. In the initial state, the external power source 24, both the first input switch 12 and the second input switch 13, and the reset switch 16 are off, and the load 21 is de-energized (FIG. 1A). However, the load interlock and reset circuit 17 is on (i.e., both loads are de-energized).

Here, the controller 2 powers on when the external power source 24 (external power) is turned on. Subsequently, once a safe state is entered, the first input switch 12 and the second input switch 13 are turned on, thereby turning on the first input circuit 14 and the second input circuit 15. At this point, the load interlock and reset circuit 17 is off, is then turned on, and is then turned off again when the reset switch 16 is pressed momentarily. The controller 2 thereby recognizes that both the first input switch 12 and the second input switch 13 are on, and that the load interlock and reset circuit 17 is off. In other words, the controller 2 recognizes that power can be sent to the loads 21, 22.

Figure 3A:
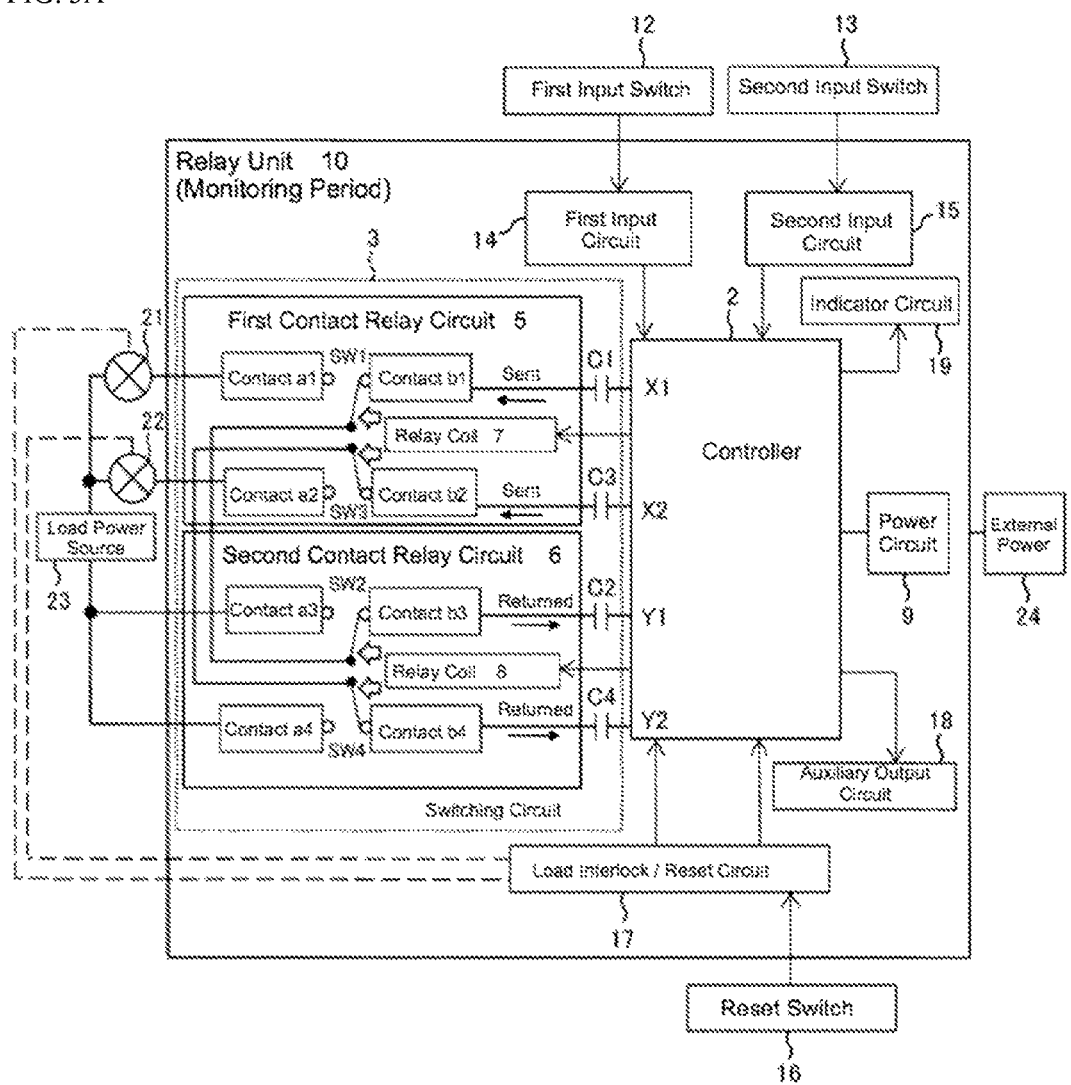
FIGS. 3A to 3D are block diagrams illustrating the configuration of the relay unit according to the embodiment during a monitoring period.
Figure 3B:
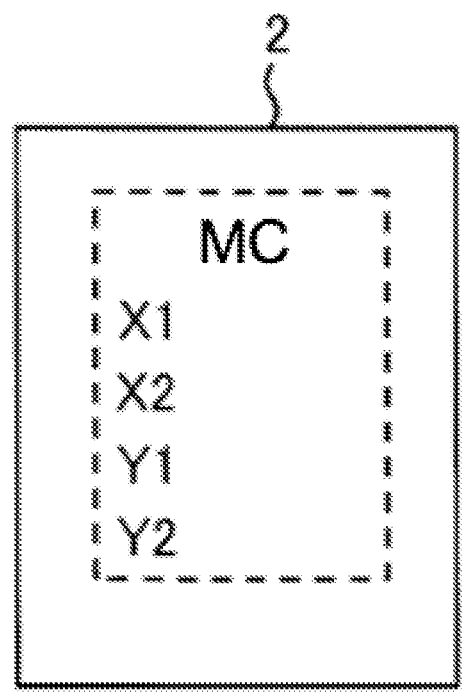

Subsequently, as illustrated in FIG. 3A, the controller 2 detects the state of the test signals MS1, MS2 (refer to FIG. 3D) sent from terminal X1 and terminal X2 to the normally closed contact b1, b3 and the normally closed contacts b2, b4 and returning on the terminal Y1 and the terminal Y2 respectively, to thereby monitor (test) the normally closed contacts b1, b3 and the normally closed contacts b2, b4 respectively.

Figure 3C:
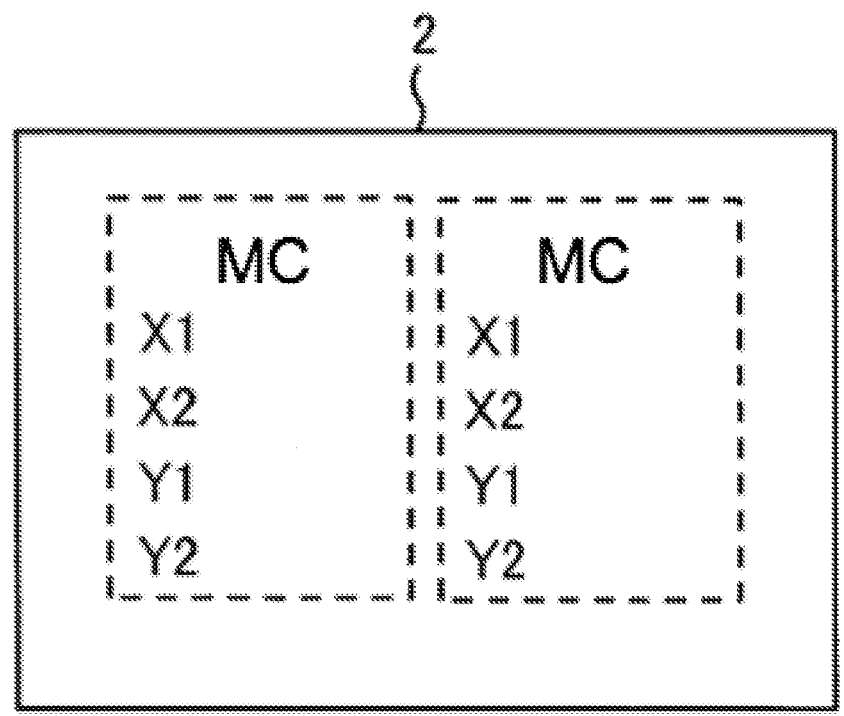
Figure 3D:
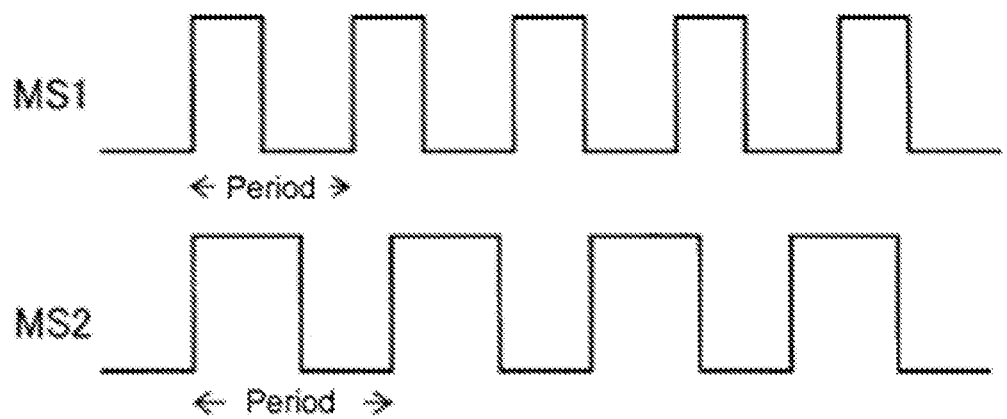

As illustrated in FIG. 3D, both the test signals MS1 and MS2 are pulse signals with mutually different periods; with a different number of pulses sent within a fixed interval, and with different duty cycles.

The controller 2 determines that the states of the returning test signals as normal when the detection result for the state of the returning test signal MS1 satisfies the first predetermined criteria, and the detection result for the state of the returning test signal MS2 satisfies the second predetermined criteria.

The first predetermined criteria may be, for example, whether the period of the test signal returned is between a first lower limit threshold and a first upper limit threshold inclusive, and whether the number of pulses of the test signal returned within a fixed interval is between a first lower limit threshold and a first upper limit threshold, inclusive. The second predetermined criteria may be, for example, whether the period of the test signal returned is between a second lower limit threshold and a second upper limit threshold inclusive, and whether the number of pulses of the test signal returned within a fixed interval is between a second lower limit threshold and a second upper limit threshold, inclusive.

The first lower and upper limit thresholds for a period, and the first lower and upper limit thresholds for the number of pulses of the test signal returned within a fixed interval may be established on the basis of the characteristics of the test signal MS1; while the second lower and upper limit thresholds for a period, and the second lower and upper limit thresholds for the number of pulses of the test signal returned within a fixed interval may be established on the basis of the characteristics of the test signal MS2.

When establishing the respective limit thresholds on the basis of the characteristics of the respective test signals MS1, MS2, the test signals MS1, MS2 are pulse signals with different characteristics as previously described, and the first predetermined criteria and the second predetermined criteria are different from each other. In other words, the range defining the first lower and first upper limit thresholds inclusive for the period and the range defining the second lower and second upper limit thresholds inclusive for the period should not overlap each other, and the range defining the first lower and first upper limit thresholds inclusive for the number of pulses within a fixed interval and the range defining the second lower and second upper limit thresholds inclusive for the number of pulses within a fixed interval should also not overlap each other.

As illustrated in FIG. 3A when the first and second contact relays 5, 6 are operating normally, the test signal MS1 and the test signal MS2 return via channel 1 and channel 2, and therefore the controller determines the states of the returning test signals MS1, MS2 are normal because the same satisfy the first predetermined criteria and the second predetermined criteria.

In contrast, the controller 2 determines that the states of the returning test signals as abnormal when at least one of the detection result for the state of the returning test signal MS1 does not satisfy the first predetermined criteria, and the detection result for the state of the returning test signal MS2 does not satisfy the second predetermined criteria.

Figure 4A:
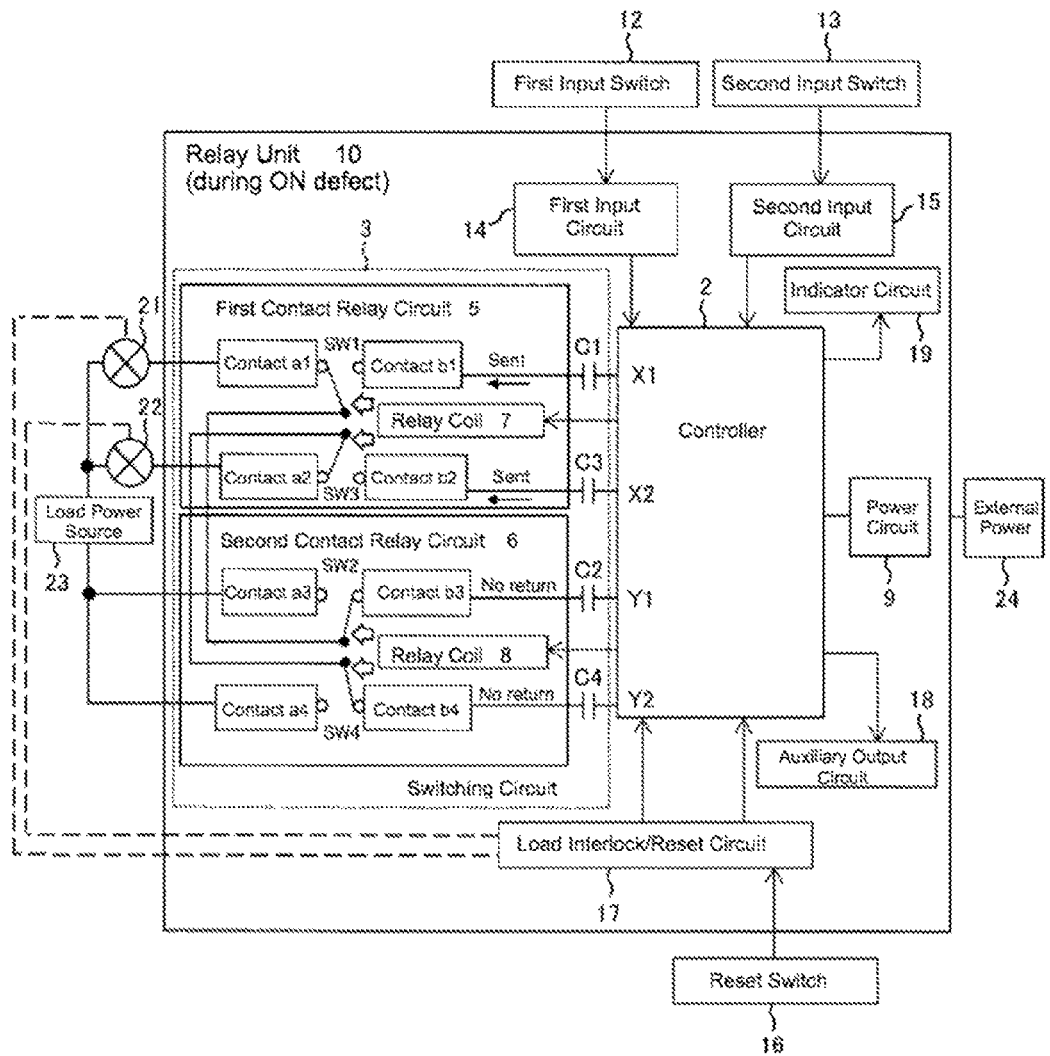
FIGS. 4A to 4D are block diagrams illustrating the configuration of the relay unit according to the embodiment experiencing an ON defect.
Figure 4B:
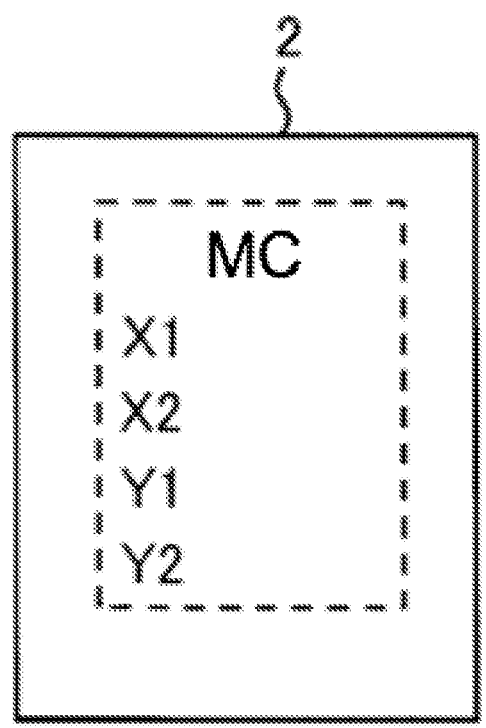
Figure 4C:
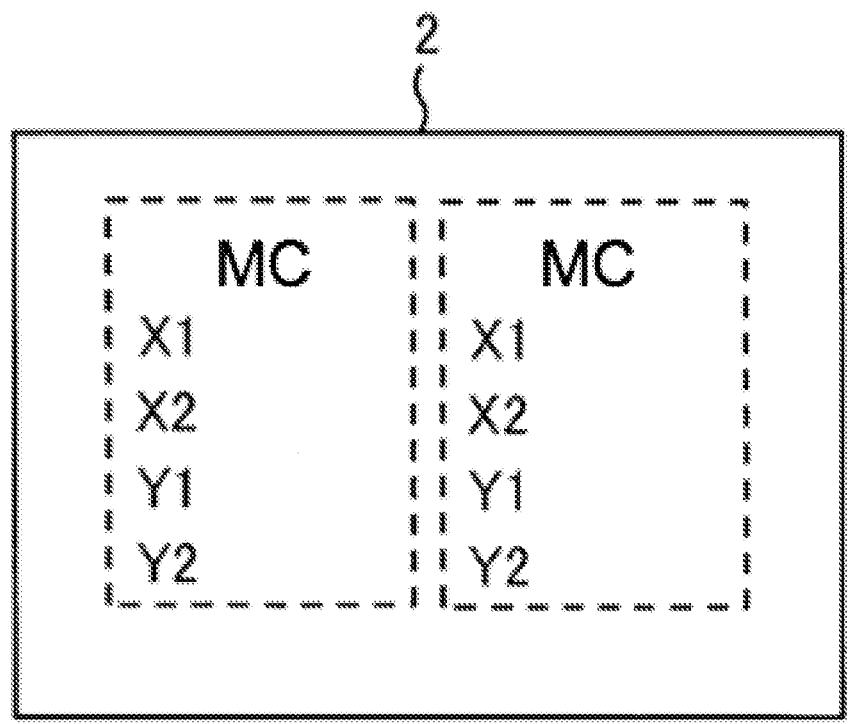
Figure 4D:
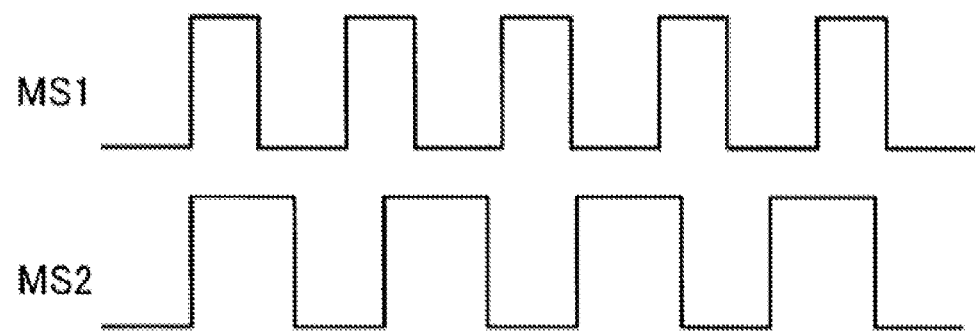

As illustrated in FIG. 4A, neither the test signal MS1 nor the test signal MS2 return to the controller when the first contact relay circuit 5 is experiencing an ON defect; the controller thus determines the states of the returning test signals MS1, MS2 are abnormal because the same do not satisfy the first predetermined criteria and the second predetermined criteria.

When there are no abnormalities in the normally closed contacts b1-b4, the controller controls the flow of current to the relay coils 7, 8 to close the normally open contacts a1-a4, and to open the normally closed contacts b1-b4 (FIG. 2A). Hereby, the load power source 23 can energize (supply power to) the loads 21, 22.

Further, when at least one of the first input switch 12 and the second input switch 13 is off (i.e., a safe state could not be entered), the controller 2 controls the flow of electricity to the relay coils 7, 8 to open the normally open contacts a1-a4, and to close the normally closed contacts b1-b4 to thereby stop energizing the loads 21, 22 (FIG. 1A). Note that the auxiliary output circuit 18 receives input from the controller 2 and notifies an external sequencer, or the like with information on whether the loads 21, 22 are energized or de-energized.

Figure 5A:
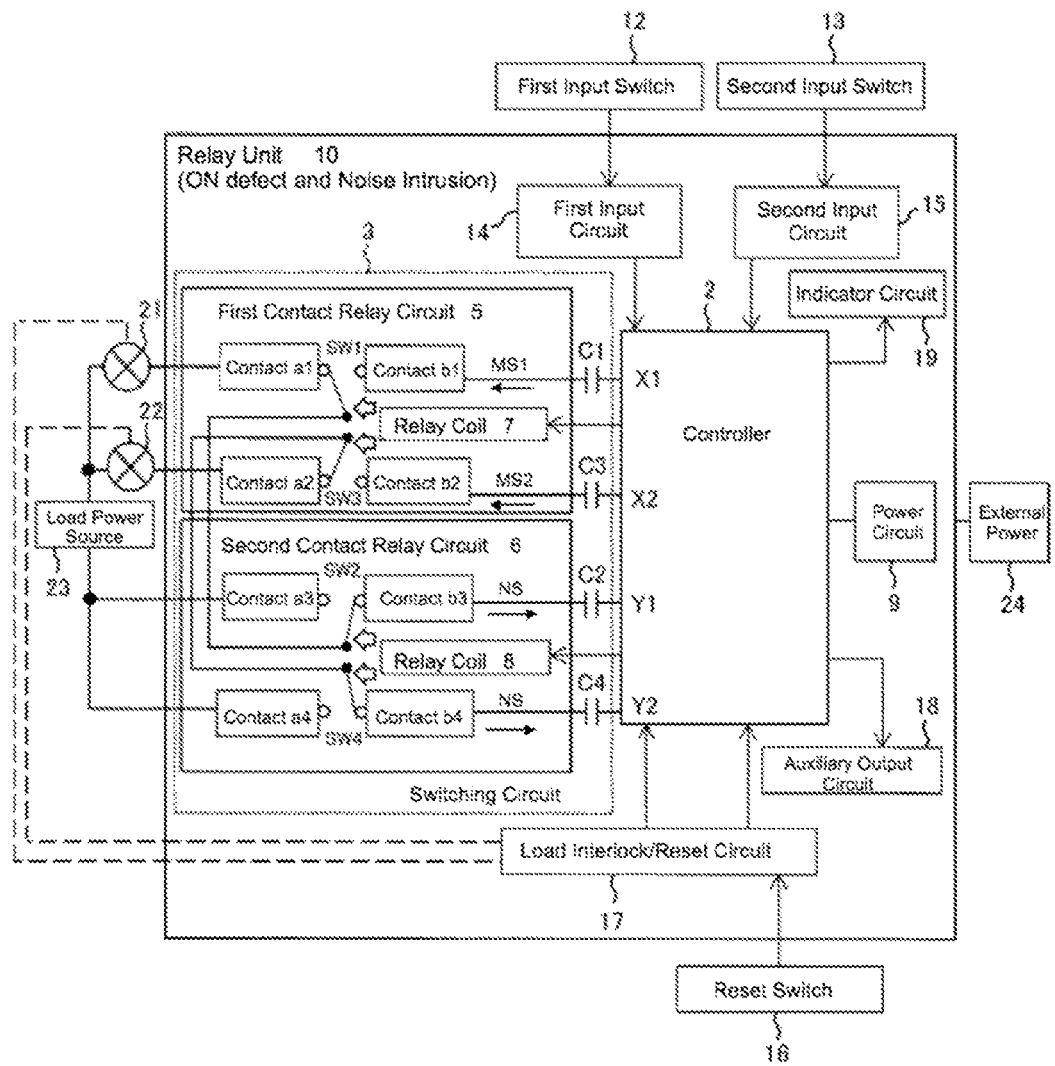
FIGS. 5A to 5D are block diagrams illustrating the configuration of the relay unit according to the embodiment experiencing an ON defect, and when noise enters the controller during the monitoring period.
Figure 5B:
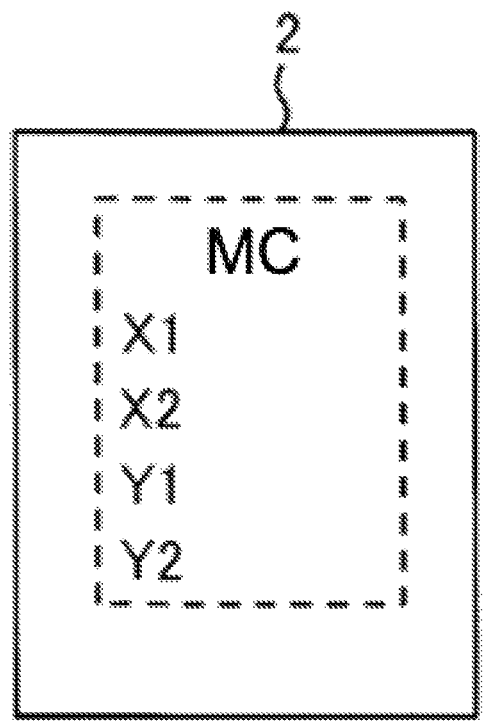
Figure 5C:
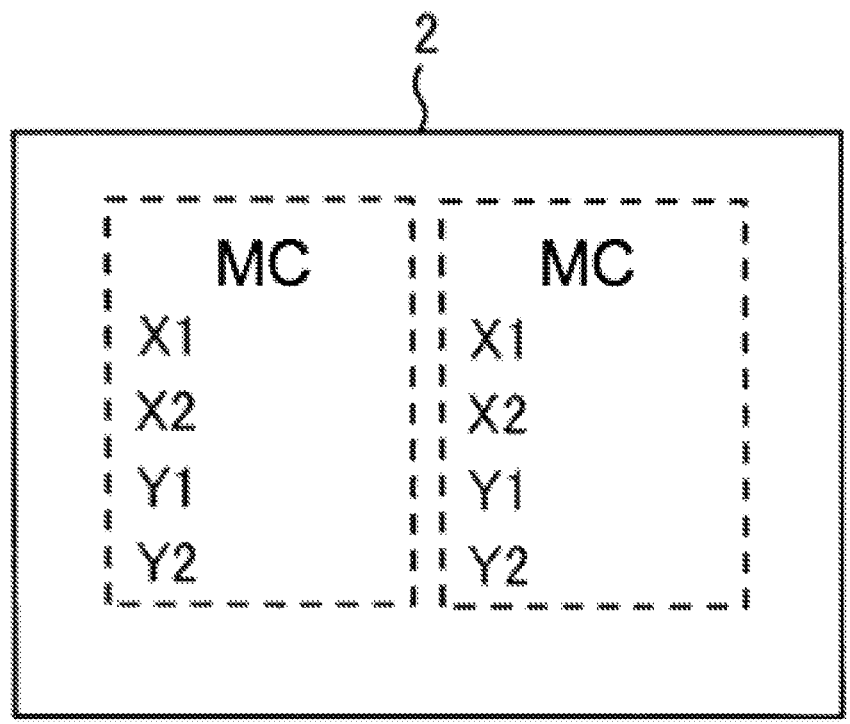

As illustrated in FIG. 3D, the test signals MS1 and MS2 used in the relay unit 10, as well as the first predetermined criteria (first threshold) and the second predetermined criteria (second threshold) used in the relay unit 10 are different. Accordingly, as illustrated in FIG. 5A, the controller is able to determine the states of the returning signals are abnormal (i.e., that the first contact relay circuit 5 is experiencing an ON defect), even when some noise NS similar to the test signal MS1 enters the controller 2 on the terminals Y1, Y2 via channel 1 and channel 2 during the monitoring period and the first contact relay circuit 5 is experiencing an ON defect (i.e., normally closed contacts b1, b2 are always on), because the detection results (i.e., the result of detecting the state of the returning test signal MS2) at terminal Y2 do not satisfy the second predetermined criteria. Thus, the reliability of testing a normally closed contact in a relay unit may be improved.

Figure 5D:
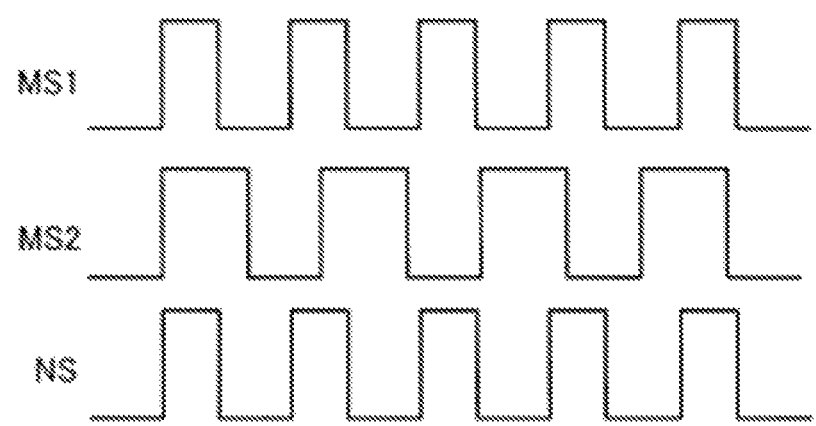

Hypothetically, if the test signal MS2 were identical to the test signal MS1 (that is, if the first predetermined criteria and the second predetermined criteria were identical), then the drawback would be that when the noise NS which is similar to the test signal MS1 as illustrated in FIG. 5D entered the terminals Y1, Y2, the controller 2 would mistakenly assess the noise NS as normal.

When the controller 2 is made up of two microcomputers (MC) as illustrated in FIG. 3C, for instance, one of the microcomputers may control the relay coil 7, while the other microcomputer may control the relay coil 8. Each of the two microcomputers detects the state of the returning first test signal at the terminal Y1 to monitor (test) the state of the normally closed contacts b1, b3, and detects the state of the returning second test signal at the terminal Y2 to monitor (test) the state of the normally closed contacts b2, b4. Thus, such a redundancy configuration in the controller 2 allows safety to be maintained even if one of the MCs were to malfunction.

While in the previous description the period or the number of pulses of the returning test signal within a fixed interval serve as the predetermined criteria, the predetermined criteria as not limited to such. For instance, the duty cycle representing the proportion of time the signal is on (high) during one period may also be used, where the first predetermined criteria is whether the duty cycle of the returning first test signal is between a first lower and upper limit threshold inclusive, the second predetermined criteria is whether the duty cycle of the returning second test signal is between a second lower and upper limit threshold inclusive.

Although in the previous description the controller 2 which controlled the switching circuit 3 used one or two microcomputers that run programs, the embodiments are not limited thereto. The controller 2 may use three or more microcomputers. Additionally, the controller 2 may be configured in hardware by assembling circuits providing each of the various functions.

As above described, the relay unit is provided with a switching circuit including first and second normally open contacts and first and second normally closed contacts; and a controller. The switching circuit is in a state of de-energizing a load when the first and second normally open contacts are open and the first and second normally closed contacts are closed, and in a state of energizing a load when the first and second normally open contacts are closed and the first and second normally closed contacts are open. The controller sends a first test signal to the first normally closed contact and detecting the state of the returning first test signal sent, sends a second test signal different from the first test signal to the second normally closed contact and detecting the state of the returning second test signal sent; and assesses the states as abnormal when at least one of the result of detecting the state of the returning first test signal does not satisfy a first predetermined criteria, and the result of detecting the state of the returning second test signal does not satisfy a second predetermined criteria different from the first predetermined criteria.

According to the above configuration, because the first test signal and the second test signal are different, the controller is able to assess that the state of the returning test signal is abnormal given that the state of the returning second test signal does not satisfy the second predetermined criteria even if the first and second normally closed contacts both experienced an ON defect, and noise similar to the returning first test signal from the first and second normally closed contacts entered the controller.

In another configuration of the relay unit the controller assesses the states as normal when the result of detecting the state of the returning first test signal satisfies the first predetermined criteria, and the result of detecting the state of the returning second test signal satisfies the second predetermined criteria.

In another configuration, both the first and second test signals are pulse signals, where at least one of the period, the duty cycle, and the number of pulses within a fixed interval are mutually different.

In another configuration of the relay unit, both the first and second test signals are pulse signals, the first predetermined criteria is whether the period of the returning first test signal is between a first lower limit threshold and a first upper limit threshold, inclusive, and the second predetermined criteria is whether the period of the returning second test signal is between a second lower limit threshold and a second upper limit threshold, inclusive.

In another configuration of the relay unit, both the first and second test signals are pulse signals, the first predetermined criteria is whether the number of pulses of the first test signal returned within a fixed interval is between a first lower limit threshold and a first upper limit threshold, inclusive, and the second predetermined criteria is whether the number of pulses of the second test signal returned within a fixed interval is between a second lower limit threshold and a second upper limit threshold, inclusive In another configuration of the relay unit, both the first and second test signals are pulse signals, the first predetermined criteria is whether the duty cycle of the returning first test signal is between a first lower limit threshold and a first upper limit threshold, inclusive, and the second predetermined criteria is whether the duty cycle of the returning second test signal is between a second lower limit threshold and a second upper limit threshold, inclusive.

In another configuration, the switching circuit in the relay unit is further equipped with third and fourth normally open contacts, and third and fourth normally closed contacts. The switching circuit is in a state of de-energizing a load when the third and fourth normally open contacts are open and the third and fourth normally closed contacts are closed, and in a state of energizing a load when the third and fourth normally open contacts are closed and the third and fourth normally closed contacts are open. When the load is de-energized, the first and third normally closed contacts are connected, and the second and fourth normally closed contacts are connected. Moreover, the first test signal returns to the controller via the first and third normally closed contacts, and the second test signal returns to the controller via the second and fourth normally closed contacts.

In another configuration of the relay unit a load and a load power source are connected in series between the first normally open contact and the third normally open contact, and a different load and the load power source are connected in series between the second normally open contact and the fourth normally open contact.

Finally, the relay unit according to embodiments of the present invention includes a switching circuit including first and second normally open contacts and first and second normally closed contacts, and a controller. The switching circuit is in a state of de-energizing a load when the first and second normally open contacts are open and the first and second normally closed contacts are closed, and in a state of energizing a load when the first and second normally open contacts are closed and the first and second normally closed contacts are open. A method of controlling the relay unit involves, while the load is de-energized, sending a first test signal to the first normally closed contact and detecting the state of the returning first test signal sent, sending a second test signal different from the first test signal to the second normally closed contact and detecting the state of the returning second test signal sent; and assessing the states as abnormal when at least one of the result of detecting the state of the returning first test signal does not satisfy a first predetermined criteria, and the result of detecting the state of the returning second test signal does not satisfy a second predetermined criteria different from the first predetermined criteria.

The present invention is not limited to above descriptions; modifications made to the above-described embodiments as appropriate on the basis of common technical knowledge, or the various combinations of the embodiments and modifications thereto are also within the scope of the invention.

A relay unit according to the invention may be adopted into machines requiring control of energization of a load.

The invention claimed is:

1. A relay unit comprising:
   a switching circuit comprising first and second normally open contacts and first and second normally closed contacts; and
   a controller; wherein
   the switching circuit:
   in a state of de-energizing a load, the first and second normally open contacts are open and the first and second normally closed contacts are closed; and,
   in a state of energizing the load, the first and second normally open contacts are closed and the first and second normally closed contacts are open;
   the controller is configured with a program to perform operations comprising:
   sending a first test signal to the first normally closed contact and detecting a return state of the first test signal;
   sending a second test signal different from the first test signal to the second normally closed contact and detecting a return state of the second test signal; and
   assessing the return state of the first and the return state of the second test signal as abnormal when at least one of:
   the return state of the first test signal does not satisfy a first predetermined criteria, and
   the return state of the second test signal does not satisfy a second predetermined criteria different from the first predetermined criteria;
   the first test signal and the second test signal are pulse signals; and
   at least one of: a period of the first test signal and the second test signal; a duty cycle of the first test signal and the second test signal; and a number of pulses within a fixed interval of the first test signal and the second test signal are mutually different.

2. The relay unit according to claim 1, wherein the controller assesses the return state of the first test signal and the return state of the second test signal as normal when the result of detecting the return state of the first test signal satisfies the first predetermined criteria, and the result of detecting the return state of the second test signal satisfies the second predetermined criteria.

3. The relay unit according to claim 1, wherein
the first predetermined criteria is satisfied when the period of the returning first test signal is between a first lower limit threshold and a first upper limit threshold inclusive; and
the second predetermined criteria is satisfied when the period of the returning second test signal is between a second lower limit threshold and a second upper limit threshold inclusive.

4. The relay unit according to claim 1, wherein
the first predetermined criteria is satisfied when the number of pulses of the returning first test signal within a fixed interval is between a first lower limit threshold and a first upper limit threshold, inclusive; and
the second predetermined criteria is satisfied when the number of pulses of the returning second test signal within a fixed interval is between a second lower limit threshold and a second upper limit threshold, inclusive.

5. The relay unit according to claim 1, wherein
the first predetermined criteria is satisfied when the duty cycle of the returning first test signal is between a first lower limit threshold and a first upper limit threshold, inclusive; and
the second predetermined criteria is satisfied when the duty cycle of the returning second test signal is between a second lower limit threshold and a second upper limit threshold, inclusive.

6. The relay unit according to claim 1, wherein
the switching unit includes third and fourth normally open contacts, and third and fourth normally closed contacts;
the switching circuit:

in a state of de-energizing the load, the third and fourth normally open contacts are open and the third and fourth normally closed contacts are closed; and in a state of energizing the load, the third and fourth normally open contacts are closed and the third and fourth normally closed contacts are open;

when the load is de-energized, the first and third normally closed contacts are connected, and the second and fourth normally closed contacts are connected; and the first test signal returns to the controller via the first and third normally closed contacts, and the second test signal returns to the controller via the second and fourth normally closed contacts.

7. The relay unit according to claim 6, wherein the load and a load power source are connected in series between the first normally open contact and the third normally open contact; and a second load different from the load and the load power source are connected in series between the second normally open contact and the fourth normally open contact.

8. A control method for a relay unit, the relay unit comprising:

a switching circuit comprising first and second normally open contacts and first and second normally closed contacts; and a controller; wherein the switching circuit:

in a state of de-energizing a load, the first and second normally open contacts are open and the first and second normally closed contacts are closed; and in a state of energizing the load, the first and second normally open contacts are closed and the first and second normally closed contacts are open;

the control method comprising:

sending a first test signal to the first normally closed contact and detecting a return state of the first test signal;

sending a second test signal different from the first test signal to the second normally closed contact and detecting a return state of the second test signal; and assessing the return state of the first and the return state of the second test signal as abnormal when at least one of the result of detecting the return state of the first test signal does not satisfy a first predetermined criteria, and the result of detecting the return state of the second test signal does not satisfy a second predetermined criteria different from the first predetermined criteria; wherein the first test signal and the second test signal are pulse signals, and at least one of: a period of the first test signal and the second test signal; a duty cycle of the first test signal and the second test signal; and a number of pulses within a fixed interval of the first test signal and the second test signal are mutually different.

9. The method according to claim 8, further comprising:

assessing the first return state and the second return states as normal when the result of detecting the return state of the first test signal satisfies the first predetermined criteria, and the result of detecting return state of the returning second test signal satisfies the second predetermined criteria.

10. The method according to claim 8, wherein the first predetermined criteria is satisfied when the period of the returning first test signal is between a first lower limit threshold and a first upper limit threshold, inclusive; and the second predetermined criteria is satisfied when whether period of the returning second test signal is between a second lower limit threshold and a second upper limit threshold, inclusive.

11. The method of claim 8, wherein the first predetermined criteria is satisfied when the number of pulses of the returning first test signal within a fixed interval is between a first lower limit threshold and a first upper limit threshold, inclusive; and the second predetermined criteria is satisfied when the number of pulses of the returning second test signal within a fixed interval is between a second lower limit threshold and a second upper limit threshold, inclusive.

12. The method of claim 8, wherein the first predetermined criteria is satisfied when the duty cycle of the returning first test signal is between a first lower limit threshold and a first upper limit threshold, inclusive; and the second predetermined criteria is satisfied when the duty cycle of the returning second test signal is between a second lower limit threshold and a second upper limit threshold, inclusive.

13. The method of claim 8, wherein the switching unit comprises third and fourth normally open contacts, and third and fourth normally closed contacts;

the switching circuit:

in a state of de-energizing the load, the third and fourth normally open contacts are open and the third and fourth normally closed contacts are closed; and in a state of energizing the load, the third and fourth normally open contacts are closed and the third and fourth normally closed contacts are open;

in a condition in which the load is de-energized, the first and third normally closed contacts are connected, and the second and fourth normally closed contacts are connected; and the first test signal returns to the controller via the first and third normally closed contacts, and the second test signal returns to the controller via the second and fourth normally closed contacts.

14. The method of claim 13, wherein the load and a load power source are connected in series between the first normally open contact and the third normally open contact, and a second load and the load power source are connected in series between the second normally open contact and the fourth normally open contact.

* * * * *